United States Patent
Kim et al.

(10) Patent No.: US 8,921,840 B2
(45) Date of Patent: Dec. 30, 2014

(54) ORGANIC LIGHT EMITTING DIODE DISPLAY

(71) Applicants: Min-Woo Kim, Yongin (KR); Gee-Bum Kim, Yongin (KR); Soo-Min Baek, Yongin (KR); Il-Nam Kim, Yongin (KR); Won-Sang Park, Yongin (KR)

(72) Inventors: Min-Woo Kim, Yongin (KR); Gee-Bum Kim, Yongin (KR); Soo-Min Baek, Yongin (KR); Il-Nam Kim, Yongin (KR); Won-Sang Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/832,676

(22) Filed: Mar. 15, 2013

(65) Prior Publication Data

US 2014/0124749 A1  May 8, 2014

(30) Foreign Application Priority Data

Nov. 7, 2012 (KR) .................. 10-2012-0125642

(51) Int. Cl.
| | |
|---|---|
| H01L 29/08 | (2006.01) |
| H01L 35/24 | (2006.01) |
| H01L 51/00 | (2006.01) |
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/15 | (2006.01) |
| H01L 27/32 | (2006.01) |
| H01L 51/52 | (2006.01) |

(52) U.S. Cl.
CPC .......... *H01L 51/5262* (2013.01); *H01L 27/322* (2013.01); *H01L 27/3246* (2013.01); *H01L 51/5271* (2013.01); *H01L 51/5284* (2013.01)
USPC ........... 257/40; 257/59; 257/72; 257/E51.018

(58) Field of Classification Search
CPC ..................... H01L 2227/323; H01L 51/0032; H01L 51/50; H01L 51/5036; H01L 51/5284; H01L 51/5296
USPC ................................ 257/40, 59, 72, E51.018
See application file for complete search history.

(56) References Cited

U.S. PATENT DOCUMENTS

| | | | | |
|---|---|---|---|---|
| 5,254,849 | A * | 10/1993 | Murakami et al. | 250/208.1 |
| 5,331,655 | A * | 7/1994 | Harder et al. | 372/45.01 |
| 5,801,798 | A * | 9/1998 | Chen et al. | 349/74 |
| 6,014,255 | A * | 1/2000 | Van Der Wal et al. | 359/485.03 |
| 7,791,115 | B2 * | 9/2010 | Kim | 257/291 |
| 7,952,107 | B2 * | 5/2011 | Daniels et al. | 257/80 |
| 8,119,204 | B2 * | 2/2012 | Ikeda et al. | 427/385.5 |
| 8,136,961 | B2 * | 3/2012 | Miller et al. | 362/242 |

(Continued)

FOREIGN PATENT DOCUMENTS

| | | | |
|---|---|---|---|
| JP | 2007-265869 | A | 10/2007 |
| KR | 10 2006-0037226 | A | 5/2006 |
| KR | 10 2009-0128437 | A | 12/2009 |

*Primary Examiner* — Ida M Soward
(74) *Attorney, Agent, or Firm* — Lee & Morse, P.C.

(57) ABSTRACT

An organic light emitting diode display includes a first substrate, an organic light emitting diode on the first substrate, a second substrate on the organic light emitting diode, and a capping layer between the second substrate and the organic light emitting diode. The capping layer collects light emitted from the organic light emitting diode, and the capping layer collects the light in a direction of the second substrate corresponding to the organic light emitting diode.

20 Claims, 6 Drawing Sheets

(56) References Cited

U.S. PATENT DOCUMENTS

| | | | |
|---|---|---|---|
| 8,300,181 B2 * | 10/2012 | Son et al. | 349/93 |
| 8,330,905 B2 * | 12/2012 | Lee et al. | 349/109 |
| 8,445,934 B2 * | 5/2013 | Lee | 257/99 |
| 8,525,963 B2 * | 9/2013 | Han et al. | 349/139 |
| 8,541,792 B2 * | 9/2013 | Thomsen | 257/88 |
| 8,559,092 B2 * | 10/2013 | Bugno et al. | 359/265 |
| 2003/0214697 A1 * | 11/2003 | Duthaler et al. | 359/296 |
| 2006/0276096 A1 * | 12/2006 | Wang et al. | 445/2 |
| 2007/0108899 A1 * | 5/2007 | Jung et al. | 313/506 |
| 2008/0030833 A1 * | 2/2008 | Park | 359/259 |
| 2008/0035931 A1 * | 2/2008 | Kwak et al. | 257/72 |
| 2008/0297042 A1 * | 12/2008 | Ahn et al. | 313/504 |
| 2009/0168067 A1 * | 7/2009 | LeCain et al. | 356/441 |
| 2011/0127498 A1 * | 6/2011 | Jung et al. | 257/40 |
| 2012/0267651 A1 * | 10/2012 | Kim et al. | 257/89 |
| 2013/0021561 A1 * | 1/2013 | Ahn | 349/77 |
| 2013/0048957 A1 * | 2/2013 | Ono | 257/40 |
| 2013/0114014 A1 * | 5/2013 | Kwak | 349/43 |
| 2013/0228754 A1 * | 9/2013 | Park | 257/40 |

* cited by examiner

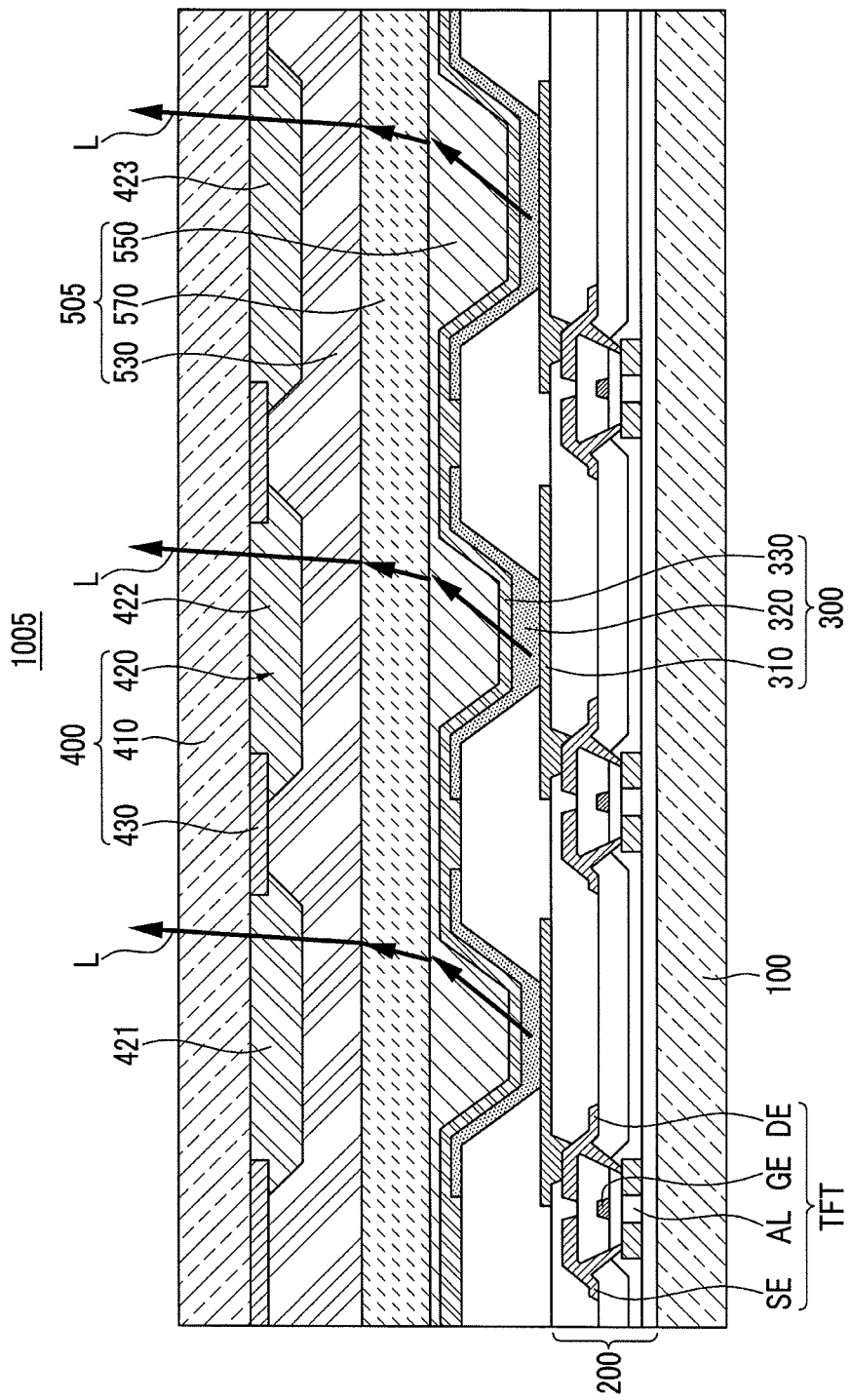

ORGANIC LIGHT EMITTING DIODE DISPLAY

RELATED APPLICATIONS

This application claims priority under 35 U.S.C. §119 to Korean Patent Application No. 10-2012-0125642 filed in the Korean Intellectual Property Office on Nov. 7, 2012, the entire contents of which are incorporated herein by reference.

BACKGROUND

A display device is a device for displaying an image, and currently, an organic light emitting diode display is receiving attention. A conventional organic light emitting diode (OLED) display includes an organic light emitting diode for emitting light for displaying an image.

The above information disclosed in this Background section is only for enhancement of understanding of the background of the described technology and therefore it may contain information that does not form the prior art that is already known in this country to a person of ordinary skill in the art.

SUMMARY

Embodiments may be realized by providing an organic light emitting diode display that includes a first substrate, an organic light emitting diode provided on the first substrate, a second substrate provided on the organic light emitting diode, and a capping layer provided between the second substrate and the organic light emitting diode. The capping layer collects light emitted by the organic light emitting diode in a direction of the second substrate corresponding to the organic light emitting diode.

The organic light emitting diode may include a first electrode provided on the first substrate, an organic emission layer that is provided on the first electrode and that emits the light, and a second electrode provided on the organic emission layer. The capping layer may collect the light that is irradiated in a direction away from the first electrode from the organic emission layer in the direction of the second substrate corresponding to the first electrode.

The first electrode may be a light reflective electrode, and the second electrode may be a light transmissive electrode. There may be a plurality of first electrodes, and the plurality of first electrodes may be separated from each other.

The organic emission layer may emit white light. The second substrate may include a plurality of color filters provided corresponding to the first electrodes, and a black matrix provided between the color filters. The capping layer may collect the light that is irradiated in a direction away from the color filter from the organic emission layer in the direction of the color filter.

The color filters may include a first color filter having a first color, a second color filter separated from the first color filter with the black matrix therebetween and having a second color, and a third color filter separated from the second color filter with the black matrix therebetween and having a third color.

The capping layer may include a plurality of high refractive patterns separated from each other and corresponding to the first electrodes, and a low refractive pattern provided between neighboring high refractive patterns. The low refractive pattern may contact the high refractive pattern. The high refractive pattern may have a greater refractive index than the low refractive pattern. The high refractive pattern may have an inversely tapered end surface.

The capping layer may include a high refractive layer separated from the organic light emitting diode and contacting the second substrate. The capping layer may further include an air layer formed between the high refractive layer and the organic light emitting diode. The capping layer may further include an intermediate refractive layer provided between the high refractive layer and the air layer.

The intermediate refractive layer may contact the high refractive layer and the air layer. The intermediate refractive layer may have a refractive index between the refractive index of the high refractive layer and the refractive index of the air layer. The capping layer may further include a low refractive layer provided between the high refractive layer and the organic light emitting diode.

The low refractive layer may contact the high refractive layer and the organic light emitting diode. The low refractive layer may have a lesser refractive index than the high refractive layer.

The capping layer may further include an intermediate refractive layer provided between the high refractive layer and the low refractive layer. The intermediate refractive layer may contact the high refractive layer and the low refractive layer. The intermediate refractive layer may have a refractive index between the refractive index of the high refractive layer and the refractive index of the low refractive layer.

BRIEF DESCRIPTION OF THE DRAWINGS

Features will become apparent to those of ordinary skill in the art by describing in detail exemplary embodiments with reference to the attached drawings in which:

FIG. 6 shows a cross-sectional view of a part of an organic light emitting diode (OLED) display according to an exemplary embodiment.

DETAILED DESCRIPTION

Figure 1:
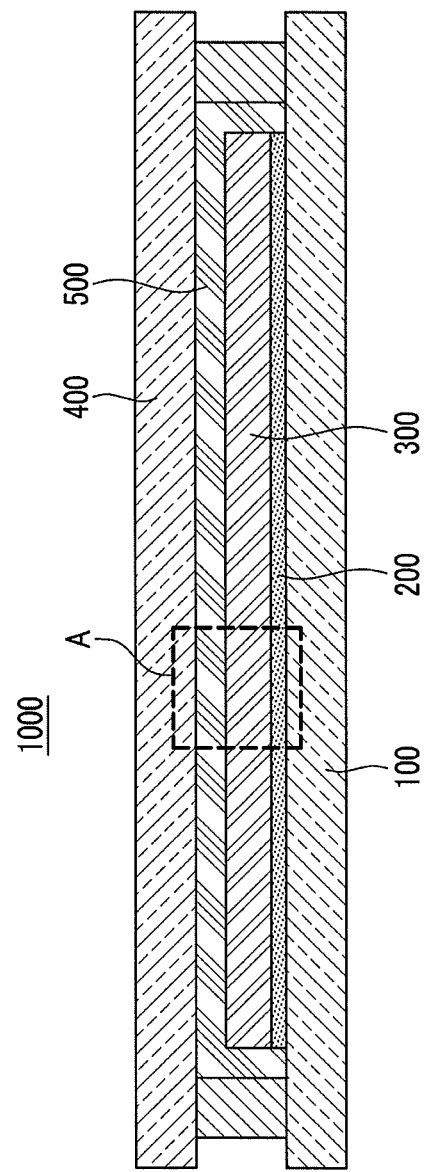
FIG. 1 shows a cross-sectional view of an organic light emitting diode (OLED) display according to an exemplary embodiment.

Hereinafter, exemplary embodiments will be described in detail with reference to accompanying drawings so as to be easily understood by a person that is ordinary skilled in the art. As those skilled in the art would realize, the described embodiments may be modified in various different ways, all without departing from the spirit or scope of the present invention.

Parts that are irrelevant to the description will be omitted to clearly describe the embodiments, and the same elements will be designated by the same reference numerals throughout the specification. Further, the size and thickness of each configuration shown in the drawings may be arbitrarily shown for understanding and ease of description, but the embodiments are not limited thereto.

In the drawings, the thickness of layers, films, panels, regions, etc., are exaggerated for clarity. For understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. The word "on" will be understood to be positioned above or below a target portion, and will not be necessarily understood to be positioned at an upper side based on a gravity direction.

An organic light emitting diode (OLED) display according to a first exemplary embodiment will now be described with reference to FIG. 1 and FIG. 2.

FIG. 1 shows a cross-sectional view of an organic light emitting diode (OLED) display according to a first exemplary embodiment. FIG. 2 shows a cross-sectional view of a part A of FIG. 1.

Figure 2:
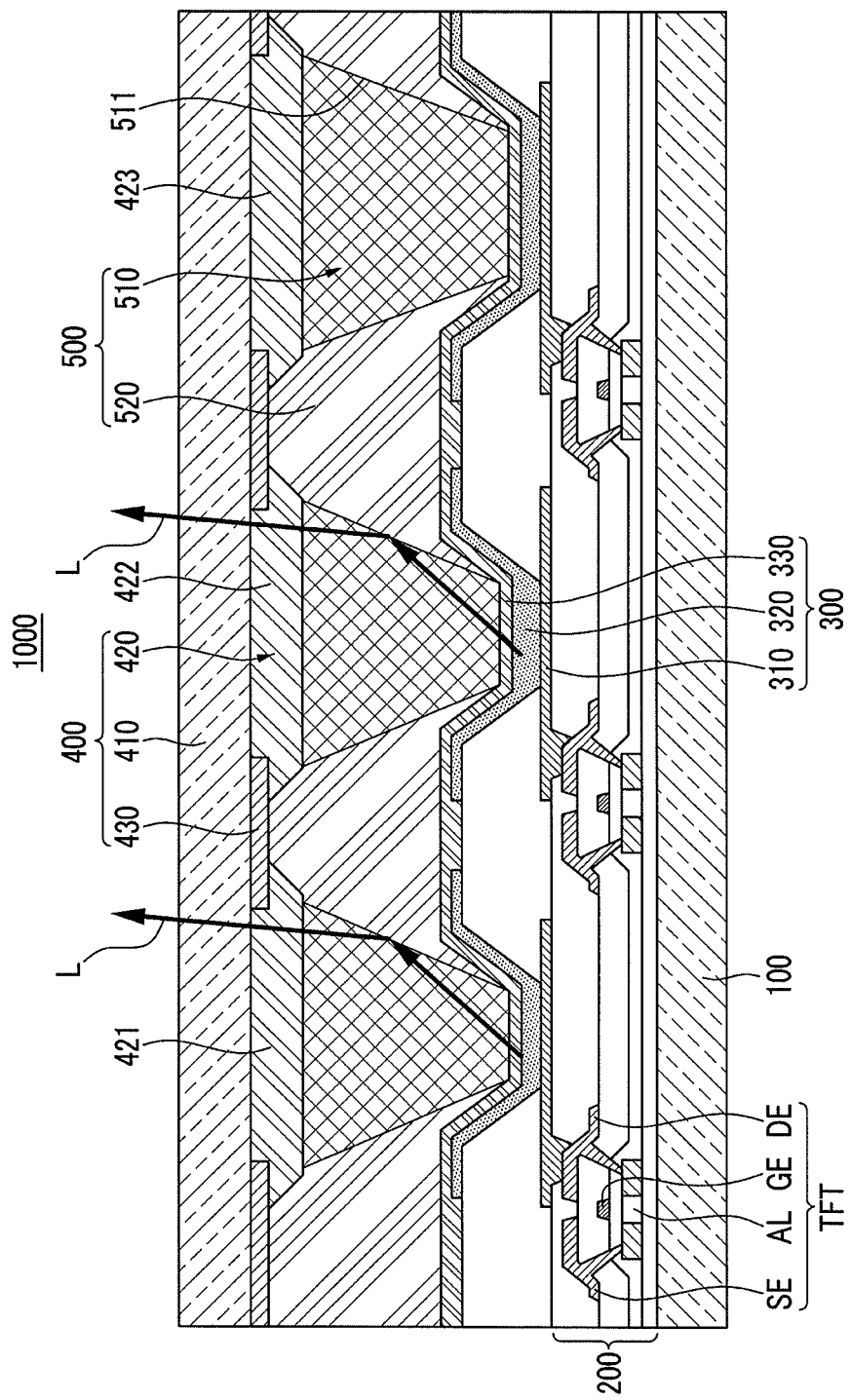
FIG. 2 shows a cross-sectional view of a part A of FIG. 1.

As shown in FIG. 1 and FIG. 2, the organic light emitting diode (OLED) display 1000 includes a first substrate 100, a wire unit 200, an organic light emitting diode 300, a second substrate 400, and a capping layer 500.

The first substrate 100 may be an insulating substrate including, e.g., glass, a polymer, or stainless steel. The wire unit 200, the organic light emitting diode 300, and the capping layer 500 are provided on the first substrate 100. The first substrate 100 faces the second substrate 400 with the wire unit 200, the organic light emitting diode 300, and the capping layer 500 therebetween. The first substrate 100 may be bonded and sealed with the second substrate 400 by a sealant with the organic light emitting diode 300 therebetween. The first substrate 100 together with the second substrate 400 protects the wire unit 200 and the organic light emitting diode 300 from external interference.

The wire unit 200 includes a switching thin film transistor (not shown) and a drive thin film transistor (TFT), and transmits a signal to the organic light emitting diode 300 to drive the organic light emitting diode 300. The organic light emitting diode 300 emits light according to the signal transmitted by the wire unit 200.

The organic light emitting diode 300 is provided on the wire unit 200.

Detailed configurations of the wire unit 200 and the organic light emitting diode 300 are shown in FIG. 2, and embodiments are not restricted to the configuration of FIG. 2. The wire unit 200 and the organic light emitting diode 300 can be formed with various configurations within the range in which a skilled person can easily change or realize them. For example, in the drawing, for better understanding and ease of description, a drive thin film transistor (TFT) is shown for the wire unit 200, and the wire unit 200 can be a 2Tr-1Cap active matrix (AM) type of wire unit 200 having two thin film transistors (TFT) and one capacitor per pixel. Embodiments of the wire unit 200 is not limited by way of a number of thin film transistors, capacitors, and wires, etc. The pixel represents a minimum unit for displaying an image, and the organic light emitting diode (OLED) display displays the image through a plurality of pixels.

For example, the wire unit 200 can include a switching thin film transistor (not shown), a drive thin film transistor (TFT), and a capacitor (not shown) for each pixel. The wire unit 200 can further include a gate line disposed in a first direction of the first substrate 100, and a data line and a drive power line crossing the gate line in an insulated manner. One pixel can be defined by edges of the gate line, the data line, and the drive power line, but is not limited thereto.

According to an exemplary embodiment, the switching thin film transistor includes a switching active layer, a switching gate electrode, a switching source electrode, and a switching drain electrode. The drive thin film transistor (TFT) includes a drive active layer (AL), a drive gate electrode (GE), a drive source electrode (SE), and a drive drain electrode (DE).

At least one of the drive active layer (AL) and the switching active layer can be formed with polysilicon or an oxide semiconductor. The oxide semiconductor includes, e.g., an oxide that is made based on zinc (Zn), gallium (Ga), tin (Sn), or indium (In), or complex oxides thereof such as zinc oxide (ZnO), indium-gallium-zinc oxide (InGaZnO$_4$), indium-zinc oxide (Zn—In—O), or zinc-tin oxide (Zn—Sn—O). The drive active layer (AL) and the switching active layer include a channel region to which an impurity is not doped, and a source region and a drain region that are formed when an impurity is doped on both sides of the channel region. For example, the impurity is variable depending on a type of the thin film transistor, and an N-type impurity or a P-type impurity is usable. When at least one of the drive active layer (AL) and the switching active layer is formed with an oxide semiconductor, an additional protection layer can be added to at least one of the drive active layer (AL) and the switching active layer so as to protect the oxide semiconductor that is weak against external factors such as a high temperature.

The switching thin film transistor is used as a switch for selecting a pixel to emit light, and the drive thin film transistor (TFT) applies drive power for emitting the organic emission layer 320 of the organic light emitting diode 300 in the selected pixel to the first electrode 310.

The organic light emitting diode 300 includes a first electrode 310, a second electrode 330 facing the first electrode 310, and an organic emission layer 320 provided between the first electrode 310 and the second electrode 330. For example, the first electrode 310, the organic emission layer 320, and the second electrode 330 are sequentially stacked from the first substrate 100. The organic emission layer 320 is provided on the first electrode 310, and the second electrode 330 is provided on the organic emission layer 320.

The first electrode 310 is provided on the first substrate 100. The first electrode 310 is, e.g., a hole injection electrode, an anode, and is a light reflective electrode. The first electrode 310 can include at least one conductive layer. For example, the first electrode 310 can include a single-layer or multi-layered conductive layer including at least one of indium tin oxide (ITO), indium zinc oxide (IZO), magnesium silver (MgAg), aluminum (Al), and silver (Ag). The first electrode 310 may include a conductive material with a greater work function compared to the second electrode 320, e.g., when hole injection performance for the organic emission layer 320 becomes greater.

There may be a plurality of first electrodes 310, and each of the first electrodes 310 is provided to correspond to one pixel. For example, the first electrodes 310 may be excluded in regions outside individual pixels, e.g., in non-pixel areas between adjacent pixels. Accordingly, the first electrodes 310 may be separated and/or spaced apart from each other, and may be disposed on the first substrate 100.

The organic emission layer 320 may be formed with, e.g., a low molecular organic material or a polymer organic material such as poly3,4-ethylenedioxythiophene (PEDOT). Further, the organic emission layer 320 may be formed with a multilayer including at least one of an emission layer, a hole injection layer (HIL), a hole transport layer (HTL), an electron transport layer (ETL), and an electron injection layer (EIL). For example, when the organic emission layer 320 includes all of them, the hole injection layer (HIL) is disposed on the first electrode 310, and the hole transport layer (HTL), the emission layer, the electron transport layer (ETL), and the electron injection layer (EIL) are sequentially stacked thereon. The organic emission layer 320 emits white light when a red emission layer, a green emission layer, and a blue emission layer are sequentially stacked or when a white emission layer for emitting white light is stacked.

The second electrode 330 is provided on the organic emission layer 320. The second electrode 330 is, e.g., an electron injection electrode, a cathode, and is a light transmissive electrode. The second electrode 330 is provided on the first substrate 100 to cover a plurality of first electrodes 310. The second electrode 330 includes at least one conductive layer. For example, the second electrode 330 can include a single-layered or multi-layered conductive layer including at least one of indium tin oxide (ITO), indium zinc oxide (IZO), magnesium silver (MgAg), aluminum (Al), and silver (Ag). The second electrode 330 may include a conductive material with a low work function compared to the first electrode 310, e.g., so as to increase the electron injection performance for the organic emission layer 320.

In the organic light emitting diode (OLED) display 1000 according to the first exemplary embodiment, the organic light emitting diode 300 emits light in the direction of the second substrate 400. That is, the organic light emitting diode (OLED) display 1000 is a front light emitting type.

The second substrate 400 is provided on the organic light emitting diode 300, and includes a second substrate main body 410, a color filter 420, and a black matrix 430.

The second substrate main body 410 may be a light transmissive substrate including glass or a polymer.

There may be a plurality of color filters 420 within the second substrate 400. The plurality of color filters 420 are positioned corresponding to the first electrodes 310, respectively. For example, each of the color filters 420 may overlap one of the first electrodes 310, and a maximum width of the color filters 420 along a first direction may be substantially equal to a length of the first electrodes 310 along the first direction so as to completely overlap each other. The color filters 420 may include a first color filter 421, a second color filter 422, and a third color filter 423.

The first color filter 421 has a first color and converts white light emitted by the organic emission layer 320 into a first color light. For example, the first color can be red.

The second color filter 422 has a second color, and is separated from the first color filter 421 with the black matrix 430 therebetween. The second color filter 422 converts white light emitted by the organic emission layer 320 into a second color light. For example, the second color can be green.

The third color filter 423 has a third color and is separated from the second color filter 422 with the black matrix 430 therebetween. The third color filter 423 converts white light emitted by the organic emission layer 320 into a third color light. For example, the third color can be blue. Accordingly, the first color, the second color, and the third color may be different from each other.

The black matrix 430 is provided between the plurality of color filters 420. The black matrix 430 may reduce the possibility of and/or prevent the light emitted by the organic emission layer 320 from being output to a place where the color filter 420 is not provided.

The capping layer 500 is provided between the second substrate 400 and the organic light emitting diode 300. For example, the capping layer 500 may be directly between the organic light emitting diode 300 and the black matrix 430 and the plurality of color filters 420.

The capping layer 500, which is provided between the second substrate 400 and the organic light emitting diode 300, collects white light emitted by the organic light emitting diode 300, e.g., collects white light emitted in the direction of the second substrate 400 corresponding to a location of the organic light emitting diode 300. For example, the capping layer 500 collects the white light that is emitted by the organic emission layer 320 of the organic light emitting diode 300 and that is irradiated in a direction away from the color filter 420 corresponding to the first electrode 310, e.g., so as to orientate the light in the direction of the color filter 420 corresponding to the first electrode 310.

The capping layer 500 includes, e.g., a plurality of high refractive patterns 510 and a plurality of low refractive patterns 520. For example, the capping layer 500 may be formed as one continuous layer that includes the high refractive patterns 510 and the low refractive patterns 520 alternately arranged therein, e.g., along a cross section thereof. In an implementation, the high refractive patterns 510 may be formed spaced apart from each other, and the low refractive patterns 520 may form a continuous layer surrounding each of the high refractive patterns 510.

The high refractive patterns 510 are separated from each other so as to be divided into portions that correspond to the plurality of first electrodes 310, e.g., each of the high refractive patterns may overlap one of the first electrodes 310. The high refractive patterns 510 may include an inversely tapered end surface 511. The high refractive pattern 510 has a greater refractive index than the low refractive pattern 520. The refractive index of the high refractive pattern 510 can be about 1.5 to about 1.8.

The low refractive patterns 520 are provided between neighboring high refractive patterns 510, respectively, and contact the respective high refractive patterns 510.

The high refractive pattern 510 and the low refractive pattern 520 respectively include one of an organic material and an inorganic material, and are selectively formed on the first substrate 100 or the second substrate 400.

An effect of the organic light emitting diode (OLED) display 1000 according to a first exemplary embodiment will now be described.

Some light (L) of the white light emitted by the organic emission layer 320 of the organic light emitting diode (OLED) display 1000 is emitted by the organic emission layer 320 and is irradiated in the direction away from the color filter 420. The some light (L) is reflected at an inversely tapered interface defined by the high refractive pattern 510 contacting the low refractive pattern 520 by a refractive index difference, and is collected in the direction of the color filter 420.

Therefore, luminous efficiency of the organic light emitting diode 300 is improved, and an amount of the some light (L) transmitting through the second substrate 400 from among the entire light emitted by the organic emission layer 320 is increased by considering a reflecting angle of the light (L) and/or widening the color filter 420.

That is, since the capping layer 500 including the high refractive pattern 510 and the low refractive pattern 520 is included, the luminous efficiency is improved and an aperture ratio is also improved to provide the organic light emitting diode (OLED) display 1000 having improved display quality.

Further, the capping layer 500 is provided between the second substrate 400 and the organic light emitting diode 300 so the organic light emitting diode 300 is protected from external impact by the capping layer 500. That is, the organic light emitting diode (OLED) display 1000 with improved handling reliability is provided.

An organic light emitting diode (OLED) display according to a second exemplary embodiment will now be described with reference to FIG. 3.

Hereinafter, only specific portions that are different from those of the first exemplary embodiment are extracted to be described, and an omitted portion of description thereof depends on the first exemplary embodiment. In addition, in the second exemplary embodiment, for better comprehension and ease of description, the same constituent elements are designated by the same reference numerals as the first exemplary embodiment.

Figure 3:
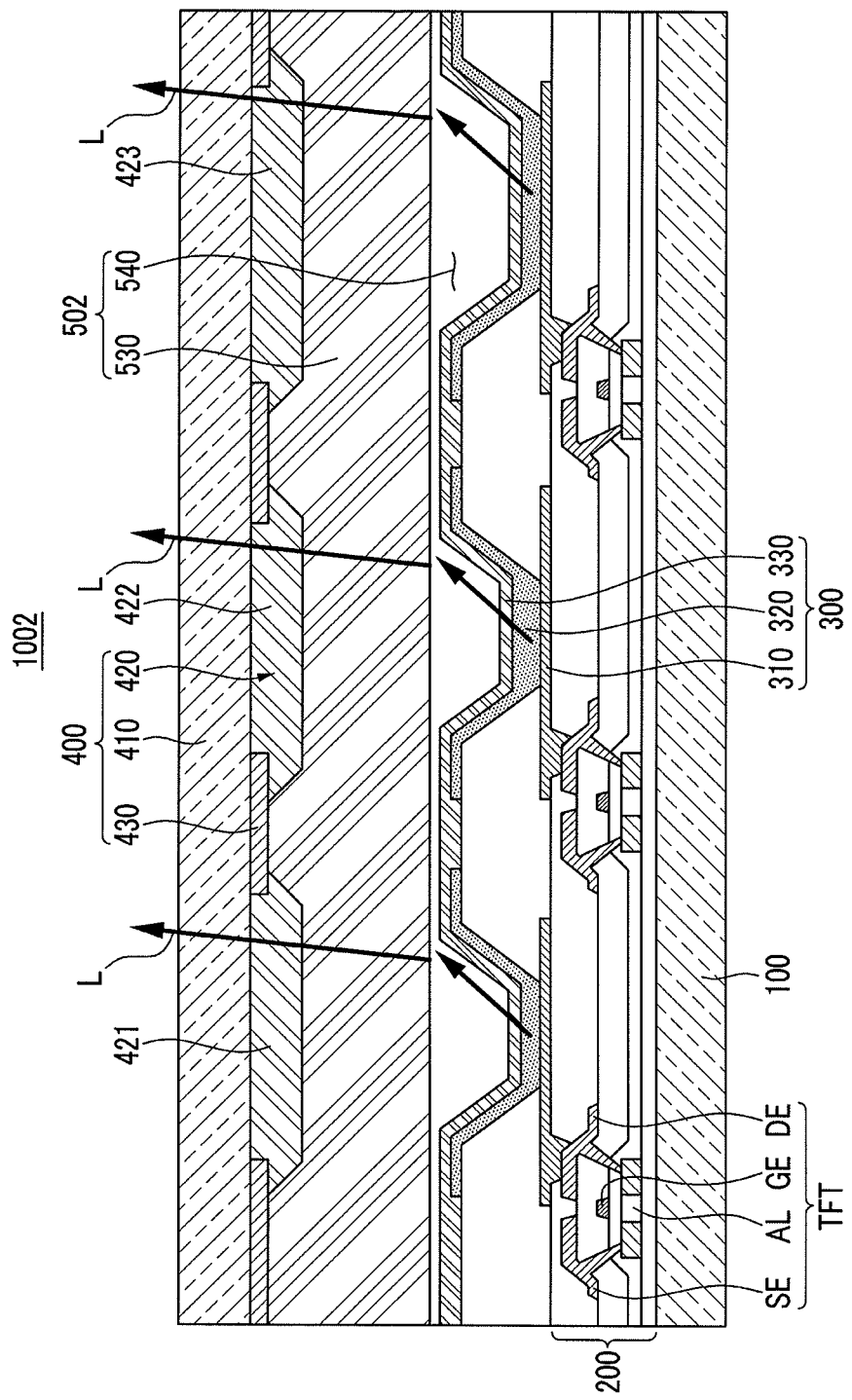
FIG. 3 shows a cross-sectional view of a part of an organic light emitting diode (OLED) display according to an exemplary embodiment.

FIG. 3 shows a cross-sectional view of a part of an organic light emitting diode (OLED) display according to a second exemplary embodiment.

As shown in FIG. 3, a capping layer 502 of the organic light emitting diode (OLED) display 1002 includes a high refractive layer 530 and an air layer 540.

The high refractive layer 530 is separated from the organic light emitting diode 300 and contacts the second substrate 400, and the air layer 540 is provided between, e.g., directly between, the high refractive layer 530 and the organic light emitting diode 300. The high refractive layer 530 has a greater refractive index than the air layer 540. For example, the refractive index of the air layer 540 may be 1, and the refractive index of the high refractive layer 530 may be about 1.5 to about 1.8.

The high refractive layer 530 includes at least one of an organic material and an inorganic material, and is formed on the second substrate 400.

An effect of the organic light emitting diode (OLED) display 1002 according to the second exemplary embodiment will now be described.

Some light (L) of white light emitted by the organic emission layer 320 of the organic light emitting diode (OLED) display 1002 is emitted by the organic emission layer 320 and is irradiated in the direction away from the color filter 420. The some light (L) is refracted at an interface where the air layer 540 and the high refractive layer 530 contact by a refractive index difference and is collected in the direction of the color filter 420.

Therefore, luminous efficiency of the organic light emitting diode 300 is improved, and an amount of the some light (L) transmitting through the second substrate 400 from among the entire light emitted by the organic emission layer 320 is increased by considering a reflecting angle of the light (L) and/or widening the color filter 420.

For example, since the capping layer 502 including the high refractive layer 530 and the air layer 540 is included, the luminous efficiency is improved and an aperture ratio is also improved to provide the organic light emitting diode (OLED) display 1002 having improved display quality.

An organic light emitting diode (OLED) display according to a third exemplary embodiment will now be described with reference to FIG. 4.

Hereinafter, only specific portions that are different from those of the first exemplary embodiment are extracted to be described, and an omitted portion of description thereof depends on the first exemplary embodiment. In addition, in the third exemplary embodiment, for better comprehension and ease of description, the same constituent elements are designated by the same reference numerals as in the first exemplary embodiment.

Figure 4:
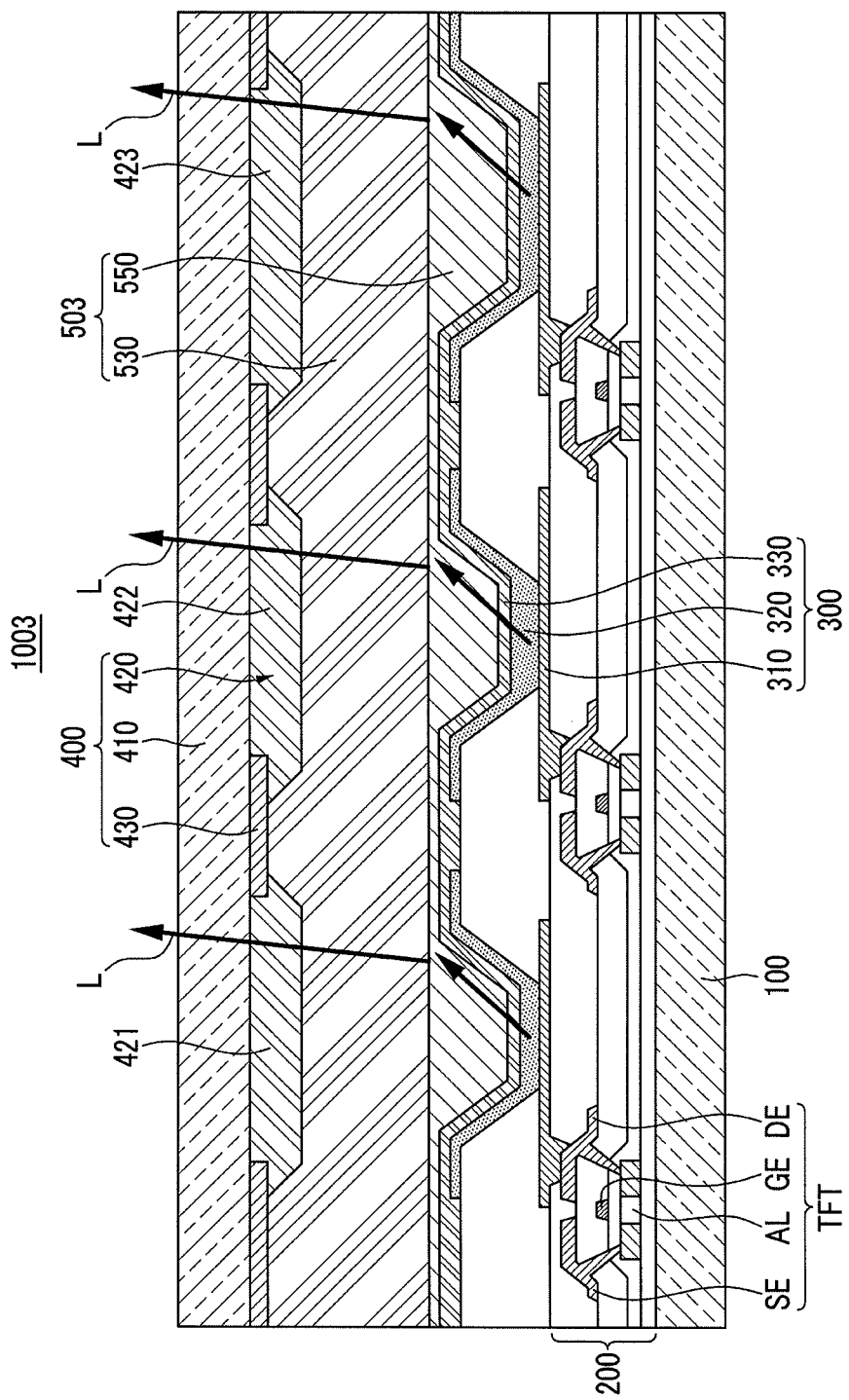
FIG. 4 shows a cross-sectional view of a part of an organic light emitting diode (OLED) display according to an exemplary embodiment.

FIG. 4 shows a cross-sectional view of a part of an organic light emitting diode (OLED) display 1003 according to a third exemplary embodiment.

As shown in FIG. 4, a capping layer 503 of the organic light emitting diode (OLED) display 1003 includes a high refractive layer 530 and a low refractive layer 550.

The high refractive layer 530 is separated from the organic light emitting diode 300 and contacts the second substrate 400, e.g., contacts the color filters 420. The low refractive layer 550 is provided between, e.g., directly between, the high refractive layer 530 and the organic light emitting diode 300. The low refractive layer 550 contacts the high refractive layer 530 and the organic light emitting diode 300. The high refractive layer 530 has a greater refractive index than the low refractive layer 550, and the low refractive layer 550 has a lesser refractive index than the high refractive layer 530. For example, the refractive index of the low refractive layer 550 may be about 1.1 to about 1.4, and the refractive index of the high refractive layer 530 may be about 1.5 to about 1.8.

The high refractive layer 530 and the low refractive layer 550 may include at least one of an organic material and an inorganic material, and may be selectively formed on the first substrate 100 or the second substrate 400.

An effect of the organic light emitting diode (OLED) display 1003 according to a third exemplary embodiment will now be described.

Some light (L) of white light emitted by the organic emission layer 320 of the organic light emitting diode (OLED) display 1003 is emitted by the organic emission layer 320 and is irradiated in the direction away from the color filter 420. The some light (L) is refracted at an interface where the low refractive layer 550 and the high refractive layer 530 contact each other by a refractive index, and is collected in the direction of the color filter 420.

Therefore, luminous efficiency of the organic light emitting diode 300 is improved, and an amount of the some light (L) transmitting through the second substrate 400 from among the entire light emitted by the organic emission layer 320 is increased by considering a reflecting angle of the light (L) and/or widening the color filter 420.

That is, since the capping layer 503 including the high refractive layer 530 and the low refractive layer 550 is included, the luminous efficiency is improved and an aperture ratio is also improved to provide the organic light emitting diode (OLED) display 1003 having improved display quality.

An organic light emitting diode (OLED) display according to a fourth exemplary embodiment will now be described with reference to FIG. 5.

Hereinafter, only specific portions that are different from those of the first exemplary embodiment are extracted to be described, and an omitted portion of description thereof depends on the first exemplary embodiment. In addition, in the fourth exemplary embodiment, for better comprehension and ease of description, the same constituent elements are designated by the same reference numerals as in the first exemplary embodiment.

Figure 5:
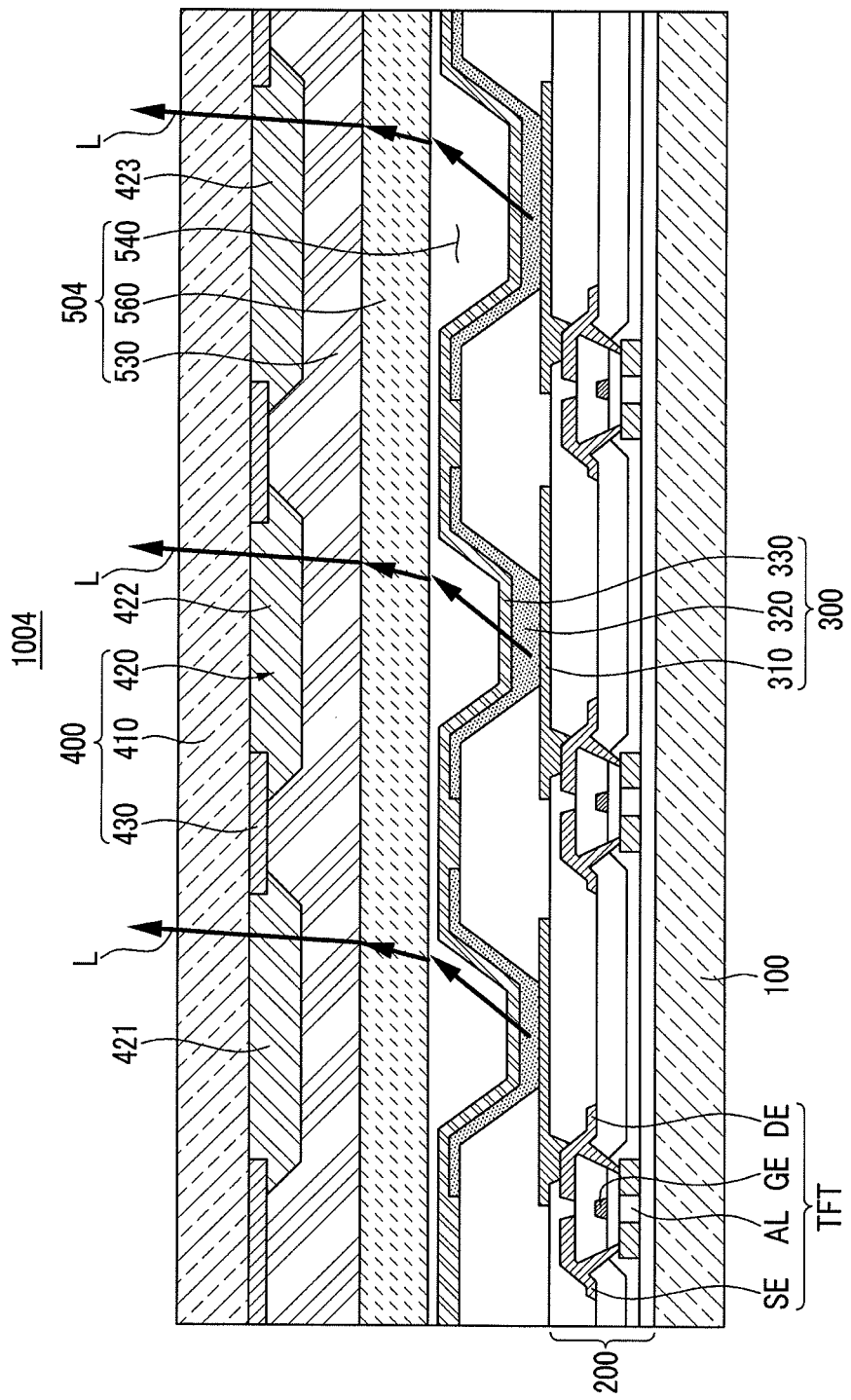
FIG. 5 shows a cross-sectional view of a part of an organic light emitting diode (OLED) display according to an exemplary embodiment.

FIG. 5 shows a cross-sectional view of a part of an organic light emitting diode (OLED) 1004 display according to a fourth exemplary embodiment.

As shown in FIG. 5, a capping layer 504 of the organic light emitting diode (OLED) display 1004 includes a high refractive layer 530, an air layer 540, and an intermediate refractive layer 560.

The high refractive layer 530 is separated from the organic light emitting diode 300 and contacts the second substrate 400. The air layer 540 is formed between, e.g., directly between, the high refractive layer 530 and the organic light emitting diode 300. The intermediate refractive layer 560 is provided between the high refractive layer 530 and the air layer 540, and contacts the high refractive layer 530 and the air layer 540, respectively. The high refractive layer 530 has a greater refractive index than the air layer 540, and the intermediate refractive layer 560 has a refractive index between the refractive index of the high refractive layer 530 and the refractive index of the air layer 540. For example, the refractive index of the air layer 540 may be about 1, the refractive index of the high refractive layer 530 may be about 1.5 to about 1.8, and the refractive index of the intermediate refractive layer 560 may be about 1.1 to about 1.4.

The high refractive layer 530 and the intermediate refractive layer 560 may include at least one of an organic material and an inorganic material, and are sequentially stacked on the second substrate 400.

An effect of the organic light emitting diode (OLED) display 1004 according to a fourth exemplary embodiment will now be described.

Some light (L) of white light emitted by the organic emission layer 320 of the organic light emitting diode (OLED) display 1004 is emitted by the organic emission layer 320 and is irradiated in the direction away from the color filter 420. The some light (L) is refracted at an interface where the air layer 540 and the intermediate refractive layer 560 contact and refracted at an interface where the intermediate refractive layer 560 and the high refractive layer 530 contact by a refractive index difference, and is collected in the direction of the color filter 420.

Therefore, luminous efficiency of the organic light emitting diode 300 is improved, and an amount of the some light (L) transmitting through the second substrate 400 from among the entire light emitted by the organic emission layer 320 is increased by considering a reflecting angle of the light (L) and widening the color filter 420.

That is, since the capping layer 504 including the high refractive layer 530, the air layer 540, and the intermediate refractive layer 560 is included, the luminous efficiency is improved and an aperture ratio is also improved to provide the organic light emitting diode (OLED) display 1004 having improved display quality.

An organic light emitting diode (OLED) display according to a fifth exemplary embodiment will now be described with reference to FIG. 6.

Hereinafter, only specific portions that are different from those of the first exemplary embodiment are extracted to be described, and an omitted portion of description thereof depends on the first exemplary embodiment. In addition, in the fifth exemplary embodiment, for better comprehension and ease of description, the same constituent elements are designated by the same reference numerals as in the first exemplary embodiment.

FIG. 6 shows a cross-sectional view of a part of an organic light emitting diode (OLED) display 1005 according to a fifth exemplary embodiment.

As shown in FIG. 6, a capping layer 505 of the organic light emitting diode (OLED) display 1005 includes a high refractive layer 530, a low refractive layer 550, and an intermediate refractive layer 570.

The high refractive layer 530 is separated from the organic light emitting diode 300 and contacts the second substrate 400. The low refractive layer 550 is provided between, e.g., directly between, the high refractive layer 530 and the organic light emitting diode 300. The intermediate refractive layer 570 is provided between, e.g., directly between, the high refractive layer 530 and the low refractive layer 550, and contacts the high refractive layer 530 and the low refractive layer 550. The high refractive layer 530 has a greater refractive index than the low refractive layer 550. The intermediate refractive layer 570 has a refractive index between the refractive index of the high refractive layer 530 and the refractive index of the low refractive layer 550. For example, the refractive index of the low refractive layer 550 may be about 1.1 to about 1.2, the refractive index of the high refractive layer 530 may be about 1.5 to about 1.8, and the refractive index of the intermediate refractive layer 570 may be about 1.3 to about 1.4.

The high refractive layer 530, the low refractive layer 550, and the intermediate refractive layer 570 respectively include at least one of an organic material and an inorganic material, and are selectively formed on the first substrate 100 or the second substrate 400.

An effect of the organic light emitting diode (OLED) display 1005 according to a fifth exemplary embodiment will now be described.

Some light (L) of white light emitted by the organic emission layer 320 of the organic light emitting diode (OLED) display 1005 is emitted by the organic emission layer 320 and is irradiated in the direction away from the color filter 420. The some light (L) is refracted at an interface where the low refractive layer 550 and the intermediate refractive layer 570 contact each other and refracted at an interface where the intermediate refractive layer 570 and the high refractive layer 530 contact each other, and is collected in the direction of the color filter 420.

Therefore, luminous efficiency of the organic light emitting diode 300 is improved, and an amount of the some light (L) transmitting through the second substrate 400 from among the entire light emitted by the organic emission layer 320 is increased by considering a reflecting angle of the light (L) and widening the color filter 420.

That is, since the capping layer 505 including the high refractive layer 530, the low refractive layer 550, and the intermediate refractive layer 570 is included, the luminous efficiency is improved and an aperture ratio is also improved to provide the organic light emitting diode (OLED) display 1005 having improved display quality.

A capping layer of an organic light emitting diode (OLED) display according to another exemplary embodiment can further include an additional refractive layer between low refractive layers, intermediate refractive layers, and high refractive layers.

By way of summation and review, an organic light emitting diode may include a first electrode, an organic emission layer, and a second electrode, which are sequentially stacked. Further, an organic light emitting diode (OLED) display including an organic emission layer for emitting white light has been developed. According to an embodiment in which the organic emission layer emits white light, a color filter may be positioned corresponding to the first electrode and the color filter modifies white light emitted by the organic emission layer into another color. Further, a black matrix that neighbors the color filter may be provided.

The organic light emitting diode (OLED) display that includes the organic emission layer that emits the white light may result in the white light digressing from the color filter. This white light may then be absorbed by the black matrix, thereby deteriorating overall luminous efficiency. Accordingly, embodiments relate to an organic light emitting diode (OLED) display that includes an organic light emitting diode for emitting white light such that an effort is made to provide improved luminous efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a first substrate;
   an organic light emitting diode on the first substrate;
   a second substrate on the organic light emitting diode; and
   a capping layer between the second substrate and the organic light emitting diode, the capping layer collecting light emitted from the organic light emitting diode, the capping layer collecting the light in a direction of the second substrate corresponding to the organic light emitting diode, wherein the capping layer includes:
      a plurality of high refractive patterns separated from each other; and
      a low refractive pattern provided between neighboring high refractive patterns.

2. The organic light emitting diode display of claim 1, wherein the low refractive pattern contacts the high refractive patterns.

3. The organic light emitting diode display of claim 1, wherein each of the plurality of high refractive patterns has a greater refractive index than the low refractive pattern.

4. The organic light emitting diode display of claim 1, wherein each of the plurality of the high refractive patterns has an inversely tapered end surface.

5. The organic light emitting diode display of claim 1, wherein:
   the organic light emitting diode includes:
      a first electrode on the first substrate;
      an organic emission layer that is on the first electrode and that emits the light; and
      a second electrode on the organic emission layer, and
   the capping layer collects the light that is irradiated in a direction away from the first electrode from the organic emission layer, the capping layer collecting the light in the direction of the second substrate corresponding to the first electrode.

6. The organic light emitting diode display of claim 5, wherein:
   the first electrode is a light reflective electrode, and
   the second electrode is a light transmissive electrode.

7. The organic light emitting diode display of claim 5, wherein the first electrode is one of a plurality of first electrodes, the plurality of first electrodes being separated from each other.

8. The organic light emitting diode display of claim 7, wherein:
   the organic emission layer emits white light,
   the second substrate includes:
   a plurality of color filters provided corresponding to the first electrodes; and
   a black matrix provided between the color filters, and
   the capping layer collects the light that is irradiated in a direction away from the color filter from the organic emission layer, the capping layer collecting the light in a direction of the color filter.

9. The organic light emitting diode display of claim 8, wherein the color filters includes:
   a first color filter having a first color;
   a second color filter separated from the first color filter with the black matrix therebetween, the second color filter having a second color, and
   a third color filter separated from the second color filter with the black matrix therebetween, the third color filter having a third color.

10. An organic light emitting diode display, comprising:
    a first substrate;
    an organic light emitting diode on the first substrate;
    a second substrate on the organic light emitting diode; and
    a capping layer between the second substrate and the organic light emitting diode, the capping layer collecting light emitted from the organic light emitting diode, the capping layer collecting the light in a direction of the second substrate corresponding to the organic light emitting diode,
    wherein the capping layer includes a high refractive layer that is separated from the organic light emitting diode and that contacts the second substrate.

11. The organic light emitting diode display of claim 10, wherein the capping layer further includes an air layer between the high refractive layer and the organic light emitting diode.

12. The organic light emitting diode display of claim 11, wherein the capping layer further includes an intermediate refractive layer between the high refractive layer and the air layer.

13. The organic light emitting diode display of claim 12, wherein the intermediate refractive layer contacts the high refractive layer and the air layer.

14. The organic light emitting diode display of claim 12, wherein the intermediate refractive layer has a refractive index between a refractive index of the high refractive layer and a refractive index of the air layer.

15. The organic light emitting diode display of claim 10, wherein the capping layer further includes a low refractive layer between the high refractive layer and the organic light emitting diode.

16. The organic light emitting diode display of claim 15, wherein the low refractive layer contacts the high refractive layer and the organic light emitting diode.

17. The organic light emitting diode display of claim 15, wherein a refractive index of the low refractive layer is less than a refractive index of the high refractive layer.

18. The organic light emitting diode display of claim 15, wherein the capping layer further includes an intermediate refractive layer between the high refractive layer and the low refractive layer.

19. The organic light emitting diode display of claim 18, wherein the intermediate refractive layer contacts the high refractive layer and the low refractive layer.

20. The organic light emitting diode display of claim 18, wherein the intermediate refractive layer has a refractive index between a refractive index of the high refractive layer and a refractive index of the low refractive layer.

* * * * *